(12) United States Patent
King et al.

(10) Patent No.: US 7,502,434 B2
(45) Date of Patent: Mar. 10, 2009

(54) FREQUENCY DETECTOR INCLUDING A VARIABLE DELAY FILTER

(75) Inventors: Eric T. King, San Jose, CA (US); Douglas Pastorello, Hudson, NH (US)

(73) Assignee: Silicon Laboratories Inc., Austin, TX (US)

( * ) Notice: Subject to any disclaimer, the term of this patent is extended or adjusted under 35 U.S.C. 154(b) by 909 days.

(21) Appl. No.: 10/813,243

(22) Filed: Mar. 30, 2004

(65) Prior Publication Data

US 2005/0220233 A1    Oct. 6, 2005

(51) Int. Cl.
*H04L 7/00* (2006.01)
*H04L 7/033* (2006.01)
(52) U.S. Cl. .................................. 375/371; 375/360
(58) Field of Classification Search .................. 375/354, 375/371, 373–376, 360, 361; 327/141, 144, 327/146–151, 156–160
See application file for complete search history.

(56) References Cited

U.S. PATENT DOCUMENTS

| | | | | |
|---|---|---|---|---|
| 4,464,771 A | * | 8/1984 | Sorensen | 375/374 |
| 5,511,100 A | * | 4/1996 | Lundberg et al. | 375/376 |
| 6,307,696 B1 | * | 10/2001 | Bishop et al. | 360/51 |
| 6,560,305 B1 | | 5/2003 | Croughwell | |

* cited by examiner

*Primary Examiner*—Tesfaldet Bocure
(74) *Attorney, Agent, or Firm*—Zagorin O'Brien Graham LLP (57) ABSTRACT

A frequency detector and frequency-locked loop suitable for use in a clock recovery circuit are disclosed. The detector is linear, and can be used in implementing a loss of lock indicator. Variable delay filtering permits the frequency detector to be less sensitive to data fluctuations, and random or pseudo random addition of jitter helps address low gain in the data stream. A VCO controller cycles through a number of control states and provides varying levels of gain, dither and delay during each of the control states.

48 Claims, 7 Drawing Sheets

| Data Transition | A | B | C | D | E | F | G | H | I | J | K | L |
|---|---|---|---|---|---|---|---|---|---|---|---|---|
| Quadrant | 1 | 1 | 1 | 1 | 3 | 2 | 2 | 2 | 3 | 3 | 3 | 3 |
| Filter Delay — 1 Transition | X | 0 | 0 | 0 | +/− | − | 0 | 0 | + | 0 | 0 | 0 |
| Filter Delay — 2 Transitions | X | X | 0 | 0 | +/− | + | − | 0 | + | + | 0 | 0 |
| Filter Delay — 3 Transitions | X | X | X | 0 | +/− | + | + | + | + | + | + | + |

| Trial | Gain | Filter | Dither (%RMS) | Density Check |
|---|---|---|---|---|
| 1 | 1 | 1 delay | 0.112 | yes |
| 2 | 1/2 | 2 delays | 0.028 | yes |
| 3 | 1/4 | 4 delays | 0.007 | yes |
| 4 | 1/8 | 8 delays | none | yes |

FIG. 14

FREQUENCY DETECTOR INCLUDING A VARIABLE DELAY FILTER

BACKGROUND

1. Field of the Invention

The present invention relates generally to frequency detectors, and more particularly to frequency detectors used in recovering clock signals from digital data streams.

2. Description of the Related Art

To reduce system costs in high-speed electrical interfaces used to transmit and/or receive data, a precision reference clock may not be provided. Instead, a clock recovery circuit including an on-chip voltage-controlled oscillator (VCO) is often used. Since on-chip VCOs used in clock recovery circuits can vary with process, supply voltage, and temperature, some method for initial frequency calibration of the VCOs is necessary. Performing an initial calibration of the VCO is made more difficult when data is encoded in a non-return to zero (NRZ) format. NRZ encoded data does not necessarily rise and fall during every clock cycle, and often does not include significant energy at the desired clock frequency to be recovered.

A common method of performing the initial VCO calibration is discussed with reference to Prior Art FIGS. 1-3. A set of quadrature clocks CLK0, and CLK90 are generated using a VCO. One of the quadrature clocks CLK0, sometimes referred to herein as the "recovered clock," is a copy of the VCO's output, and the other quadrature clock CLK90 is a 90 degree phase shifted version of the first clock CLK0. Data transitions 105, 107, and 109 are each assigned to one of four quadrants Q1, Q2, Q3, or Q4 based on the state (either high or low) of both CLK0 and CLK90. For example, data transition 105 occurs at time 110, when CLK0 is high and CLK90 is low. Consequently data transition 105 is assigned to quadrant Q1. Similarly, data transition 107 occurs at time 120, when both CLK0 and CLK90 are low, and is assigned to quadrant Q4. Data transition 109, which occurs at time 135 when CLK0 is low and CLK90 is high, is assigned to quadrant Q3. Although not illustrated, a data transition that occurs when both CLK0 and CLK90 are high is assigned to quadrant Q2.

Figures 1, 2:
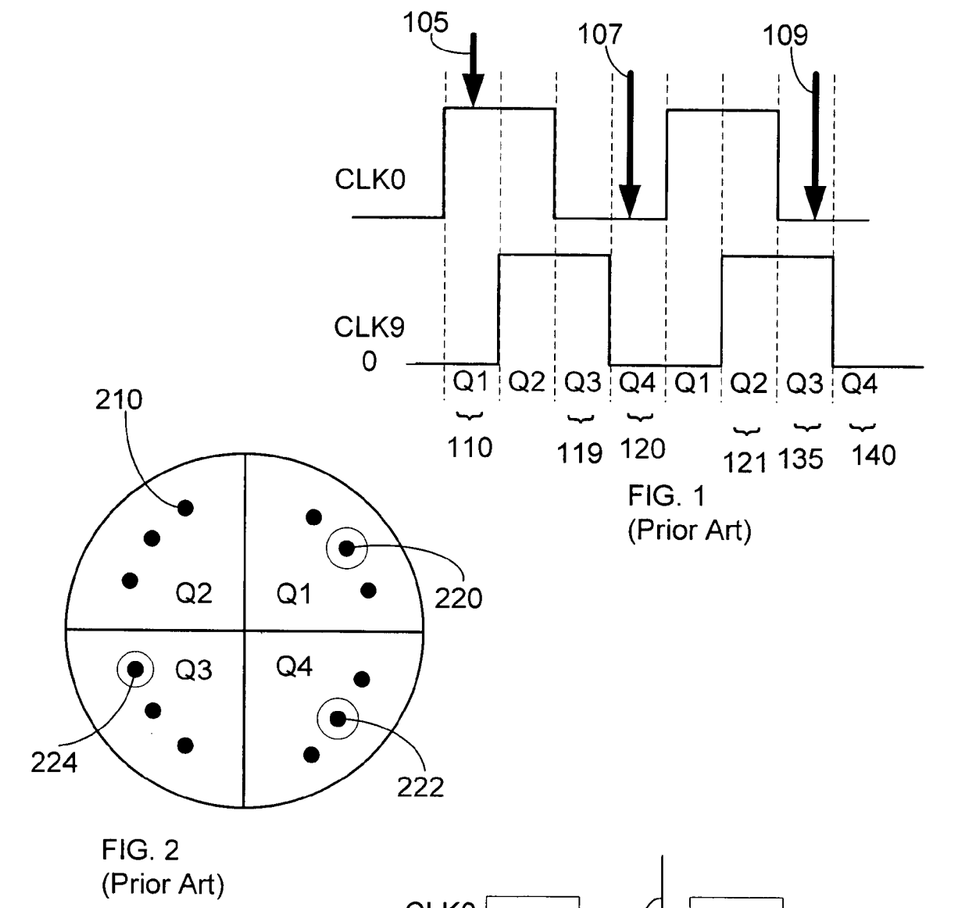
FIG. 1 is a prior art timing diagram illustrating the relationship between a data transition, and a pair of quadrature clocks.
FIG. 2 is a prior art diagram illustrating the quadrant relationships between a series of data transitions that can be used to determine a frequency difference between data transitions and a recovered clock.

Prior art FIG. 2 illustrates how the assigned quadrants can be used to determine whether the frequency of a VCO is higher or lower than the frequency of a data stream. For purposes of this discussion, assume that data transitions 105, 107 and 109 (FIG. 1) correspond to a series of data transitions in a digital data stream being supplied to a clock recovery circuit. FIG. 2 illustrates quadrants Q1-Q4 arranged in a polar coordinate system, progressing in time from Q1 to Q4, counterclockwise. Solid dots 210 correspond to possible data transitions, while black dots with a circle around them represent actual data transitions. So, for example, circled dot 220 may correspond to data transition 105 (FIG. 1), circled dot 222 may correspond to data transition 107, and circled dot 224 may correspond to data transition 109. Note that in the illustrated example, no data transition occurs in quadrant Q2, so there is no circled dot in that quadrant.

In general, if each of a series of data transitions occurs in the same quadrant during successive clock cycles, then the frequency of the VCO is the same as the frequency of the data stream. If two data transitions occur in adjacent quadrants, then there is a frequency difference between the data stream and the VCO. In particular, if a data transition occurs in the quadrant located counterclockwise from the quadrant in which the immediately preceding data transition occurred, then the VCO's frequency is faster than the data stream's frequency, while if a data transition occurs in the quadrant clockwise from the quadrant in which the immediately preceding data transition occurred, then the VCO's frequency is slower than the data stream's frequency. If the data transitions occur in opposing quadrants, e.g., Q1 and Q3, or Q2 and Q4, then there is a frequency difference between the VCO and the data stream, but it cannot be determined from only the quadrant information whether the frequency of the VCO is faster or slower than the frequency of the data stream.

In the example illustrated in FIGS. 1 and 2, each of the data transitions 105, 107 and 109, occurs one quadrant clockwise from the preceding data transition, so the frequency of the data stream is greater than the frequency of the VCO. Although not illustrated, if data transition 107 had occurred at time 121 during quadrant Q2 and data transition 109 had occurred during quadrant Q3 of a subsequent quadrature clock cycle (not illustrated), then each data transition would have occurred one quadrant counterclockwise of the previous data transition, indicating that the frequency of the data stream was lower than the frequency of the VCO.

Figure 3:
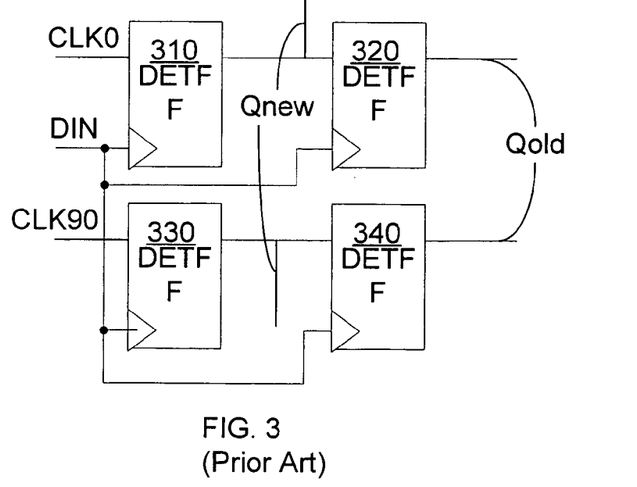
FIG. 3 is a schematic diagram of a prior art quadrant shift register useful in selecting data transitions for frequency comparison.

Prior art FIG. 3 illustrates how two adjacent data transitions are obtained for comparison by some conventional clock recovery circuits. All of the latches 310, 320, 330, and 340 are clocked by a data transition on line DIN. CLK0 is placed on the data input of latch 310 and CLK90 is placed on the data input of latch 330. The first data transition, data transition 105 of FIG. 1, triggers latches 310 and 330, and causes their outputs to be placed on lines Qnew. The Qnew outputs of latches 310 and 330 indicate the level of CLK0 and CLK90 at the time of data transition 105, and can therefore be used to indicate to which quadrant (Q1 in this example) data transition 105 is assigned. When the next data transition 107 occurs, the values of CLK0 and CLK90 that correspond to the arrival of data transition 105 are output from latches 320 and 340 on lines Qold, while the values of CLK0 and CLK90 corresponding to data transition 107 are output on lines Qnew. The values on lines Qold and Qnew can then be used to determine the frequency relationship between the VCO and the data stream as discussed with reference to FIG. 2.

Although the method of determining the frequency relationship between a VCO and a data stream is relatively simple, it does have certain limitations. For example, data fluctuations can cause conventional detectors to output false or ambiguous results under some circumstances. For example, if transition 107 were to have occurred at time 119 or 135 (thereby placing the data transition in quadrant 3), then there would be no indication of whether the VCO was operating at a frequency higher or lower than the frequency of the data stream. This problem can occur during low gain conditions, or when the data stream includes a very repetitive pattern of data.

Results of a quadrant comparison may also be misleading when NRZ encoded data has a low transition density. When this occurs, data transitions are infrequent enough so that, for example, data transition 107 may occur at time 140 instead of occurring at time 120. Since data transition 107 would still be assigned to quadrant Q4, the algorithm would likely assume that the data stream was operating at a frequency higher than the frequency at which the VCO of the clock recovery circuit was operating, when in fact the frequency of the data stream would be less than the frequency of the VCO.

Inter symbol interference (ISI) can cause large high-frequency phase errors which create misleading quadrant crossings, e.g. quadrant crossings in a direction opposite to the average direction of quadrant crossings. In such situations, the conventional algorithm described above could cause a clock recovery circuit to settle at the wrong frequency, resulting in maladjustment of the VCO in the clock recovery circuit.

Clearly, an improved way of recovering clocks from data signals would be advantageous.

SUMMARY

A frequency detector and frequency-locked loop (FLL) suitable for use in a clock recovery circuit are described herein. A frequency detector according to an embodiment of the present invention receives as input a data signal and two quadrature clocks. The data signal may be a non-return to zero (NRZ) encoded data stream generated by a data clock, which may be said to be embedded in the data stream. The quadrature clocks include a recovered clock generated by a VCO, and a shifted recovered clock which is 90 degrees out of phase with the recovered clock. The states of the recovered clock and the shifted recovered clock at the time of a data transition are used to assign data transitions to one of four quadrants. Quadrant information associated with these data transitions can then be used to determine a frequency relationship between the VCO and the data stream.

In one embodiment, the frequency detector includes a filter that selects quadrant information associated with particular data transitions to use in determining the frequency relationship between the VCO and the data stream. The determination may be based on a variable delay between a first data transition and a second data transition. The filter then provides the quadrant information to other portions of the frequency detector. The delay between data transitions is, in one embodiment, determined by the number of data transitions between selected data transitions. So, for example, if a delay of 1 is used, the first and second data transitions are selected. If the delay is 2, the first and third data transitions are selected, and so on.

Based on the quadrant information, the frequency detector determines whether the frequency of the data clock embedded in the data stream is slower or faster than the frequency of a recovered clock generated by the VCO. In at least one embodiment, this determination is performed by a detector that receives the quadrant information from the filter, and asserts one or more signals indicative of the frequency relationship between the embedded clock and the recovered clock. So, for example, if a particular set of first and second selected data transitions indicate that the frequency of the VCO is greater than the frequency of the data clock, then the detector will output a frequency decrease signal to a VCO controller, indicating that the frequency of the VCO should be decreased. Conversely, if the detector determines that the frequency of the VCO is less than the frequency of the data clock, then the detector will output a frequency increase signal. In one embodiment, these frequency increase and/or frequency decrease signals are accumulated in counters, and an indication of the number of frequency adjustment signals, both increases and decreases, is provided for use by a VCO controller in adjusting the frequency of the VCO.

Various embodiments of the present invention also include a transition density counter. If the transition density counter determines that there is an insufficient number of transitions to ensure an accurate frequency determination, the frequency detector sets a transition density output to indicate that no frequency adjustments should be made to the VCO, regardless of whether the frequency adjustment signals so indicate.

A frequency-locked loop, according to an embodiment of the present invention, includes at least one frequency detector to determine, from quadrant data associated with comparisons between variably delayed data transitions, when a frequency of a recovered clock is different than the frequency of a data clock encoded in a data signal, and to provide an indication thereof. In one embodiment, the frequency-locked loop also includes a controller configured to cycle through multiple control states, with each control state providing particular control parameters for the frequency-locked loop. The controller is connected to receive the outputs of the frequency detector and to generate control signals based on indications provided by the frequency detector. So, for example, during a particular control cycle the controller may set particular values of gain, filter delay and/or dither. Each of these control parameters affects the way in which a controllable oscillator responds to frequency increase and/or frequency decrease signals generated by the frequency detector.

In one embodiment, the control parameters generated by the controller can reduce the sensitivity of the frequency detector to fluctuations of the data encoded in the data stream. A dither control parameter may allow a random or pseudo random adjustment to the controllable oscillator's frequency, to account for conditions of low gain, a repetitive data pattern, and the like. In addition, at least one embodiment of the present invention employs a linear frequency detector that produces a transition density indicator useful for loss of lock (LOL) purposes.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 4:
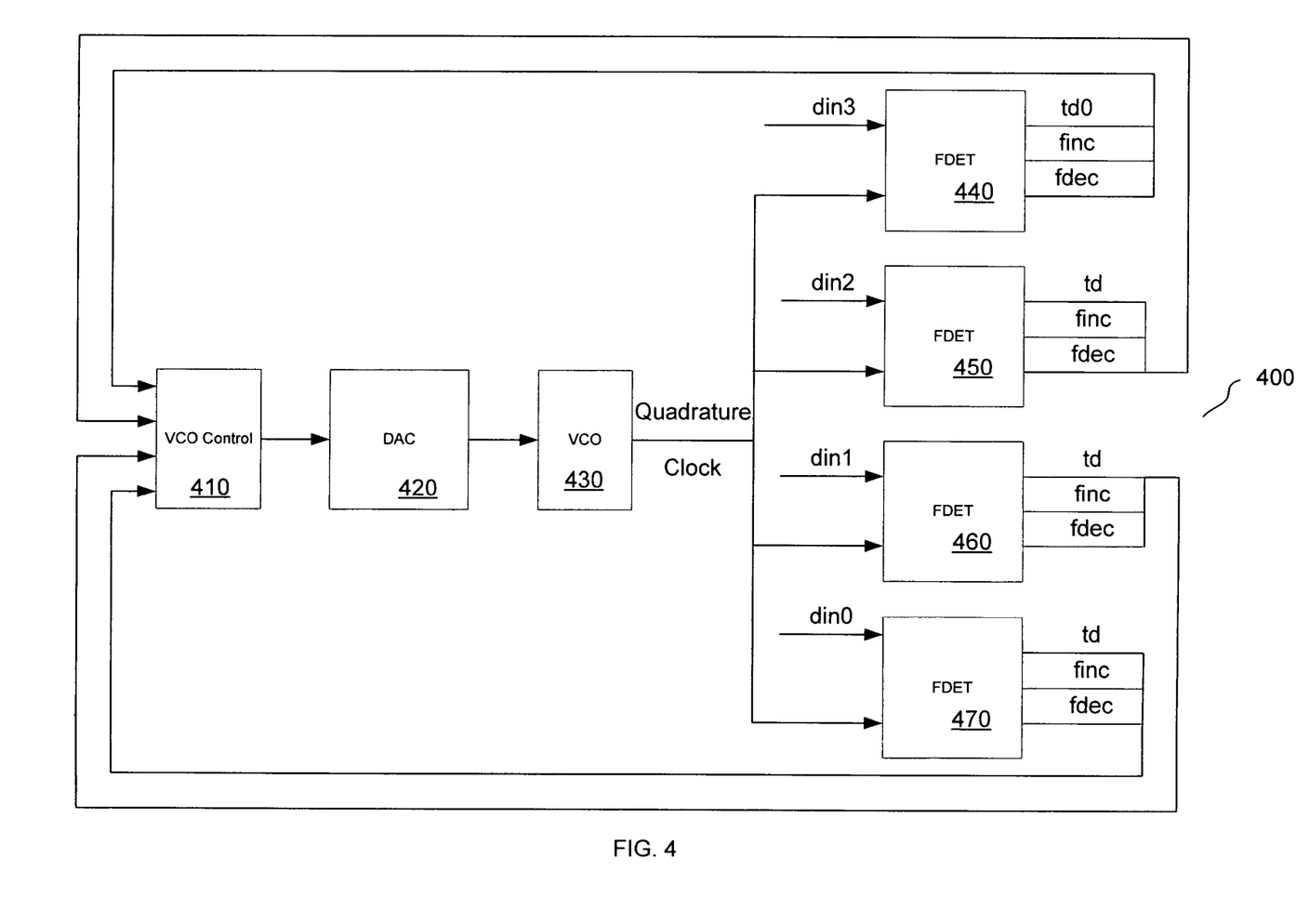
FIG. 4 is a block diagram of a frequency-locked loop according to an embodiment of the present invention.

Referring first to FIG. 4, a frequency-locked loop suitable for use in a clock and data recovery circuit is illustrated according to an embodiment of the present invention. Frequency-locked loop (FLL) 400 includes VCO control 410, digital to analog converter (DAC) 420, voltage controlled oscillator (VCO) 430, and four frequency detectors (FDET) 440, 450, 460, and 470. Each of the frequency detectors 440-470 is configured to receive a data channel (DIN0-DIN3), and a set of quadrature clocks from VCO 430. Each frequency detector 440-470 compares the frequency of the data in its respective channel to the frequency of the VCO 430 and produces outputs FINC and FDEC indicating whether the frequency of the VCO 430 should be increased or decreased to make the frequency of VCO 430 match the average frequency of the data channels DIN0-DIN3. Frequency detectors 440-470 also provide transition density signals TD that indicate when the frequency adjustment signals FINC and FDEC should be ignored due to low transition density.

The three outputs of each frequency detector 440-470 are connected to the inputs of VCO control 410. VCO control 410 combines the outputs of all four frequency detectors 440-470, applies control parameters, as subsequently discussed, and provides a control signal to DAC 420. DAC 420 converts the digital control signal provided by VCO 410 into an analog signal suitable for controlling the voltage controlled oscillator 430. The control signal provided by DAC 420 causes the frequency of VCO 430 to be adjusted to an average frequency of all four data channels, and the output of VCO 430 is then fed back to frequency detectors 440-470, where the new frequency is compared to the frequency of each data channel, and the cycle repeats.

It should be noted that although FIG. 4 illustrates a FLL 400 that serves four data channels, with the frequency of VCO 430 being centered around an average frequency of the four data channels, implementations including fewer or more data channels (and corresponding frequency detectors) may be constructed according to the principals set forth herein. In addition, it should be appreciated that digital to analog converters, voltage controlled oscillators, and their equivalents are well known to those skilled in the art. Thus, specific choices of implementations for DAC 420 and VCO 430 can be made without departing from the spirit and scope of the present invention.

Figure 5:
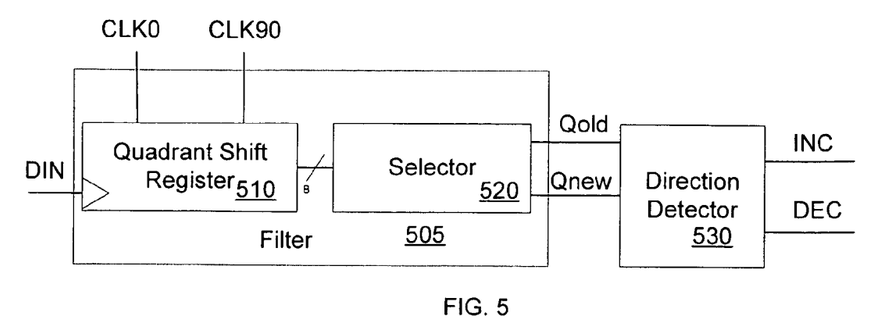
FIG. 5 is a block diagram illustrating a filter and a direction detector according to an embodiment of the present invention.
Figure 6:
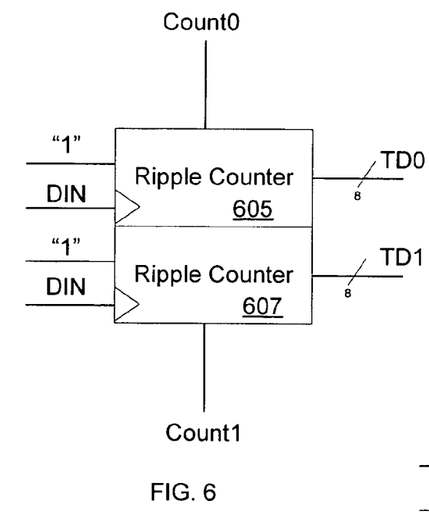
FIG. 6 is a block diagram illustrating a transition density counter according to an embodiment of the present invention.
Figure 7:
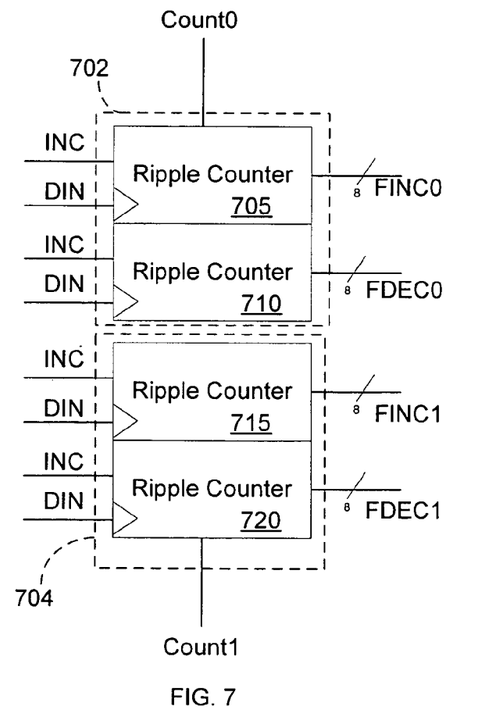
FIG. 7 is a block diagram illustrating a frequency adjustment counter according to an embodiment of the present invention.

Referring next to FIGS. 5-7, the frequency detector and some of its sub-components will be discussed according to an embodiment of the present invention. FIG. 5 illustrates filter 505 and direction detector 530 according to an embodiment of the present invention. Inputs received at frequency detectors 440-470 (FIG. 4) are received in each of the frequency detectors at filter 505. A quadrant shift register 510 receives the recovered clock CLK0 and shifted recovered clock CLK90, and is clocked by data transmissions from data channel DIN. In the illustrated embodiment, quadrant shift register 510 is capable of holding information related to eight transitions of data stream DIN. Other embodiments may be implemented, however, wherein quadrant shift register 510 is configured to hold more or fewer than eight data transitions.

The output of quadrant shift register 510 is connected to selector 520, and provides the quadrant information associated with each data transition to selector 520. Selector 520 chooses which of the quadrant information associated with the data transitions are to be provided to direction detector 530 for a comparison. Selector 520 provides quadrant information for a first selected data transition over Qold to direction detector 530, and delivers quadrant information associated with a second selected data transition over line Qnew. Direction detector 530 compares the quadrant information for the first selected data transition and the second selected data transition to determine a frequency relationship between the VCO 430 (FIG. 4) and the data stream. Once direction detector 530 determines, based on the quadrant information of the selected data transitions, whether the data frequency is faster or slower than the VCO frequency, direction detector 530 generates an increase signal, a decrease signal, or neither, indicating the appropriate direction in which to adjust the frequency of the VCO to match the frequency of the data stream.

Referring next to FIG. 7, two counters, 702 and 704, are illustrated. The increase and decrease signals generated by direction detector 530 are provided to counters 702 and 704. Both counters 702 and 704 count the number of increase and decrease signals generated by direction detector 530 whenever the corresponding enable signals COUNT0, COUNT1, are active. Counter 702 includes ripple counter 705 and ripple counter 710, while counter 704 includes ripple counter 715 and ripple counter 720. The operation of both counters, 702 and 704, are analogous. Two counters are used in one embodiment to provide a staggered, overlapping count window so that no transitions are missed. Ripple counters 705 and 715 count the number of increase frequency signals generated by direction detector 530, and ripple counters 710 and 720 count the number of decrease signals generated by direction detector 530. The output of ripple counter 705 FINC0 and the output of ripple counter 715 FINC1 are provided to VCO control 410 (FIG. 4) to indicate that the frequency of VCO 430 should be increased. The output of ripple counters 710 FDEC0, and the output of ripple counter 720 FDEC1, are provided to VCO controller 410 (FIG. 4) to indicate that the frequency of VCO 430 should be decreased.

Referring next to FIG. 6, ripple counters 605 and 607 are illustrated, and serve the purpose of transition density counters in one embodiment of the present invention. Like counters 702 and 704, the transition density ripple counters 605 and 607 are used to provide staggered, overlapping count windows. Ripple counters 605 and 607 may be configured to count each data transition of data channel DIN. The outputs of ripple counters 605 and 607, TD0 and TD1, respectively, are provided to VCO control 410 (FIG. 4) to indicate whether sufficient data transitions are present in the data stream DIN to allow an accurate frequency determination.

Figure 8:
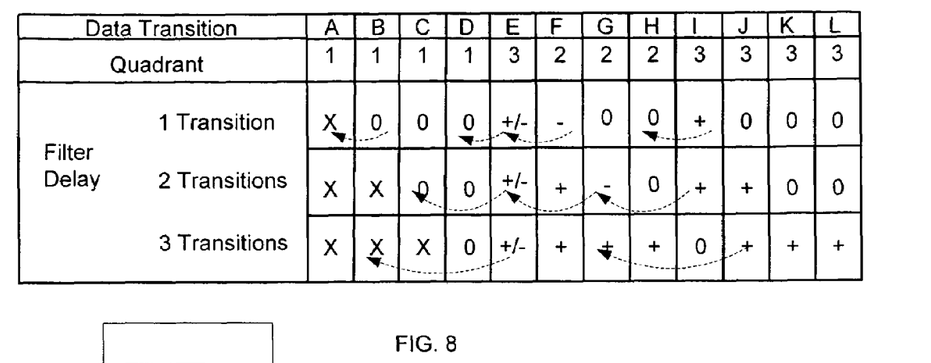
FIG. 8 is a chart illustrating a variable delay filtering technique according to an embodiment of the present invention.

Referring next to FIGS. 5 and 8, the function of selector 520 in filter 505 will be discussed in greater detail according to an embodiment of the present invention. As noted earlier, selector 520 receives quadrant information from quadrant shift register 510. Selector 520 then chooses a first and second data transition to provide to direction detector 530 for comparison. FIG. 8 illustrates the way in which selector 520 decides which quadrant information to provide to direction detector 530 according to one embodiment.

The first row in the table of FIG. 8 labeled Quadrant shows the arrival quadrant to which a series of data transitions has been assigned. The next three rows of the table in FIG. 8 illustrate the effect of selecting data transitions based on a variable delay. For example, the "1 transition" row illustrates the comparison performed by direction detector 530 when selector 520 uses a delay of 1 to select data transitions. The "2

Transitions" and "3 Transitions" rows illustrate comparisons performed on 2 delay and 3 delay data transitions, respectively.

In one embodiment, when selector 520 is set to select data transitions delayed by 1, the quadrant of each data transition is compared to the quadrant of each immediately preceding data transition. So, e.g., direction detector 530 compares data transition B with first data transition A, data transition C with data transition B, etc. The result of comparing data transition B with data transition A is 0, because both data transitions A and B are assigned to quadrant 1. When direction detector 530 compares data transition E to data transition D, the result is indeterminate, because data transitions D and E occur in opposing quadrants, and may indicate either that the frequency of the voltage control oscillator needs to be increased or decreased. When direction detector 530 compares data transition F to data transition E, the result is negative, indicating that the frequency of the VCO should be decreased to match the frequency of the data channel. A comparison of data transition I (quadrant 3) with data transition H (quadrant 2) gives a result which is positive, and indicates that the frequency of the VCO should be increased to match the frequency of the data channel.

In at least one embodiment, selector 520 varies the delay between selected data transitions so that, during particular intervals, quadrant information for data transitions delayed by either one delay, two delays, four delays or eight delays is used. In the case of two transition delays shown in the "2 Transitions" row of FIG. 8, selector 520 selects quadrant information from every other data transition for delivery to detector 530. For example, selector 520 might provide data transition C over line Qold (FIG. 5) and data transition E over line Qnew (FIG. 5). The result of the comparison in this example would be indeterminate, because data transitions E and C occur during opposing quadrants.

During a time in which selector 520 is using two delays as its selection criteria, selector 520 may also provide data transition G and E to direction detector 530 for comparison. In such a case, the result indicates that the frequency of the VCO should be reduced to match the frequency of the data channel, since transition G occurs in quadrant 2 and transition E occurs in quadrant 3. Similarly, a comparison of data transition I (quadrant 3) and data transition G (quadrant 2) yields a result indicating that the frequency of the VCO should be increased to match the frequency of the data channel.

The "3 Transitions" row illustrates the case where selector 520 provides quadrant information delayed by three. For example, data transition E (quadrant 3) is compared to data transition A (quadrant 1), yielding an indeterminate result. A comparison between data transition J and data transition F yields a result indicating that the VCO frequency should be increased to match the frequency of the data channel.

Note that selector 520 does not necessarily provide only every third data transition or every fifth data transition when operating in a delay selection mode. Instead, every data transition may be provided to direction detector 530. Note, however that the combination of selected data transitions provided over lines Qold and Qnew are separated by an appropriate delay. So, for example, when selector 520 is using a single delay for selection, data transitions A will be provided on line Qold and B will be on line Qnew. When selector 520 is operating in a two delay mode, data transition A may still be provided on line Qold, but data transition C is provided on line Qnew. Note that during the next clock cycle, data transition B could be provided on Qold while data transition D was provided on line Qnew. Thus, selector 520 does not necessarily provide quadrant information for fewer data transitions during different delay modes, but instead provides quadrant information for different pairs of data transitions.

Figure 9:
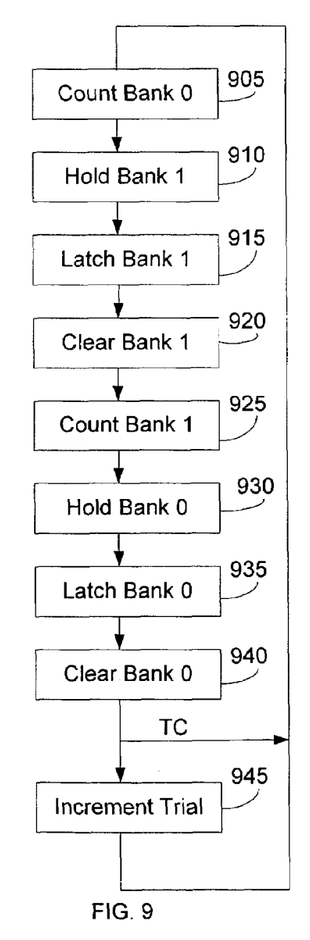
FIG. 9 is a flow diagram illustrating a counting sequence according to an embodiment of the present invention.

Referring next to FIGS. 6, 7 and 9, staggered overlapping count windows will be discussed. At 905, bank 0, which corresponds to ripple counter 605 in FIG. 6 and counter 702 in FIG. 7, begins to count. At 910, bank 1, which corresponds to ripple counter 607 in FIG. 6 and counter 704 in FIG. 7, is held. At 915, bank 1 is latched, so that the data held in bank 1 can be delivered to VCO control 410 (FIG. 4). At 920, bank 1 is cleared, and at 925 bank 1 begins to count. After bank 1 begins to count in 925, bank 0 is held at 930. At 935, bank 0 is latched and at 940, bank 0 is cleared. If the trial counter TC indicates that a particular trial has completed, then after bank 0 is cleared at 940, the trial number is incremented at 945. If, however, the current trial has not finished yet, after bank 0 is cleared, bank 0 begins counting again.

In at least one embodiment, a clock provided by VCO 430 is divided to produce a slower clock, e.g. a 78 MHz clock, and the tasks illustrated in FIG. 9 are performed at that slower frequency. In some such embodiments, the ripple counters themselves are implemented in slower speed logic by passing quadrant information, captured at a high rate, through a serial-to-parallel converter before providing the quadrant information to the counters for processing at the reduced rate. Data can be cleanly transferred across clock domains by reading data from each count bank during hold periods. Note that each bank counts for five cycles with a two cycle overlap, in that an accumulator in the DAC 420 (FIG. 4) is updated by VCO control 410 every eight cycles. The timer is incremented every eight cycles, assuming transition density requirements are met. In at least one embodiment, a trial lasts about 10 time constants, or long enough for the filter 505 (FIG. 5) to settle.

It should be appreciated that at least some embodiments of the present invention may employ an initial frequency calibration, which is not illustrated. For example, in one embodiment, an initial frequency error should be on the order of 10% or less to ensure a frequency lock. In such an embodiment, the recovered clock can be initially tuned within the required range, for example using an on-chip oscillator, before employing the techniques disclosed herein. Various methods of performing such an initial frequency calibration may be implemented by those of ordinary skill in the art.

Figure 10:
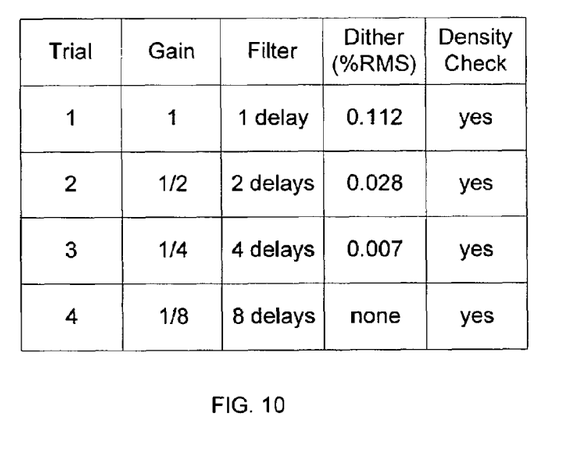
FIG. 10 is a chart illustrating the control parameters provided during respective trials according to an embodiment of the present invention.

Referring next to FIG. 10, different trails through which VCO control 410 cycles are discussed according to an embodiment of the present invention. Each trial, or control state, corresponds to particular settings of gain, filter delay and dither. During trial 1, the gain of the frequency-locked loop is set to 1, the filter delay of selector 520 (FIG. 5) is set to use one delay, and a random or pseudo random amount of dither corresponding to 0.112% RMS is induced into the VCO 430 (FIG. 4) to compensate for possible low gain in the data channel. During trial 2, the gain is set to ½, the filter is set to implement two delays, and the dither is set to 0.028% RMS. During trial 3, the gain is set to ¼, the filter is set to four delays, and the dither is set to 0.007% RMS. Finally, during trail 4, the gain is set to ⅛, the filter delay is set to eight and no dither is added. Note that as the trials progress from 1 to 4 the filter delay increases from one delay to eight delays. Note that the delay is implemented gradually, starting with only one delay and progressing to eight delays, to prevent the filter 505 from providing false outputs if the frequency error is too high. Applying the delay gradually allows the frequency error to diminish between settings.

Figure 11:
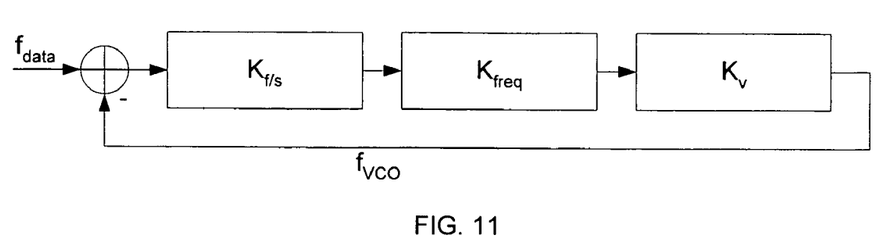
FIG. 11 is a control diagram illustrating a frequency detector according to an embodiment of the present invention.

Referring next to FIG. 11, calculation of a bandwidth over which a frequency detector operates is discussed according to an embodiment of the present invention. Begin by noting that there are four quadrants and that as discussed with reference to FIG. 9, the increments and decrements are counted by two separate banks with a 7/5 bank overlap. Note also that one rotation from quadrant 1 through quadrant 4 and back again to quadrant 1 occurs every $1/(f_{data}-f_{vco})$ seconds. Therefore, there are $4*(7/5)*(f_{data}-f_{vco})$ counts/seconds and Kf=4*(7/5). For four data channels, $f_{3dB}=(4*Kf*K_{freq}*Kv)/(2*\pi)$. With $K_{freq}=16$ and Kv=1.3 kHz/count, $f_{3db}=74.2$ kHz.

Figure 12:
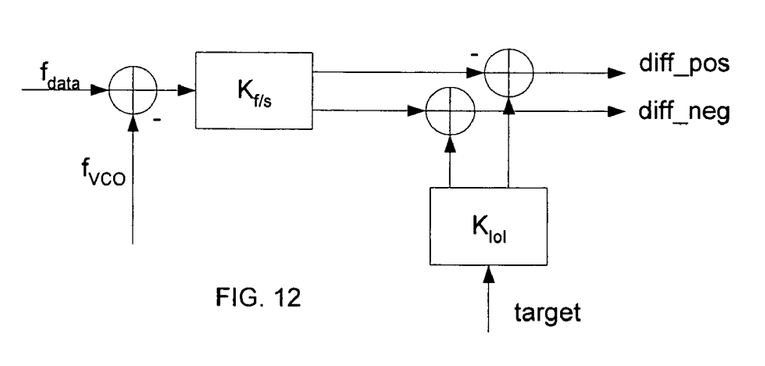
FIG. 12 is a control diagram illustrating a loss of lock system according to an embodiment of the present invention.

Referring next to FIG. 12, a loss of lock calculation is discussed according to an embodiment of the present invention. Recall that for the illustrated embodiments there are four channels and eight stages of filtering in quadrant shift registers 510 (FIG. 5). The number of counts=$4*8*Kf*T_{int}*\Delta f$. The finite state machine illustrated in FIG. 9, which affects both the transition density and the frequency adjustments is, in this example, operated by a divide by 32 clock. Therefore, Kf=4*(7/5), $f_{err}=\Delta f/f_{nom}$ and $T_{int}=N*32/f_{nom}$. Therefore, counts=$4*8*4*(7/5)*32*N*f_{err}$. With N=8192, $K_{lol}=256$ and target=92, $f_{err}=(92*256)/4/8/4(7/5)/32/8192=0.05\%$.

Figure 13:
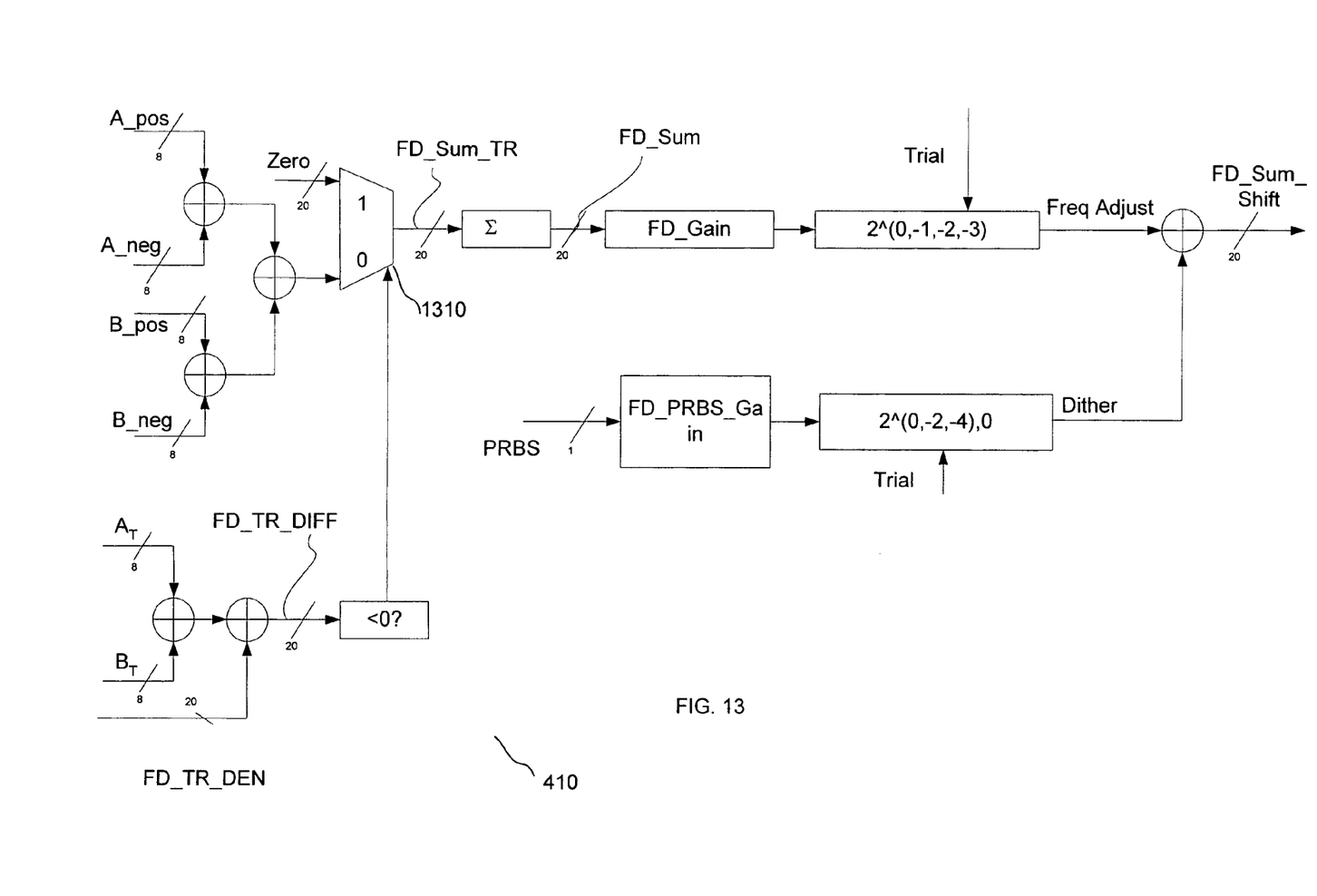
FIG. 13 is a control diagram illustrating a controller according to an embodiment of the present invention.

Referring next to FIG. 13, the data path through a controller is discussed according to an embodiment of the present invention. A frequency detector generates frequency increase or decrease signals, illustrated as A_pos, A_neg, B_pos and B_neg. In this case A_pos and A_neg correspond to the counts generated by bank 0 (FIG. 7), and B_pos and B_neg correspond to counts generated by bank 1 (FIG. 7). Two banks of transition density outputs labeled $A_T$ and $B_T$ are also shown on the left-hand side of FIG. 13. A transition density reference signal FD_TR_DEN is also received at VCO control.

The transition density counts from $A_T$ and $B_T$ are summed and compared to the transition density reference FD_TR_DEN. A transition density difference FD_TR_DIFF less than 0 indicates that insufficient data transitions were received to ensure an accurate frequency determination. In such a case, multiplexer 1310 will pass the signal on input 1, which contains all zeros. Otherwise, the number of counts present at the 0 input of multiplexer 1310 will be provided to the remaining elements. Note that the number of counts indicated by the signal present at input 0 of multiplexer 1310 is, in one embodiment, composed of the net positive or negative counts from each of banks A and B again netted together to determine an overall count of increase or decrease signals generated by a frequency detector.

VCO control 410 sums the net counts, or zeros, from all four data channels (FD_Sum_TR) to produce FD_Sum. VCO control 410 applies a gain to FD_Sum based on the current trial in which VCO control 410 is operating. Note that in one embodiment, a gain based on the frequency adjustment signals from the frequency detectors (FD_Gain) is first applied, and then decreased according to the current trial.

A pseudo random bit is generated, and a gain is applied at FD_PRBS_Gain. The pseudo random bit will be either a 0 or a 1, so that either some amount of dither (determined by the gain applied and the particular trial in which VCO control 410 is operating) will be supplied, or no dither at all will be added. Any dither is added to the adjustment to generate a composite FD_Sum_Shift signal which is then provided to DAC 420 for control of VCO 430.

Figure 14:
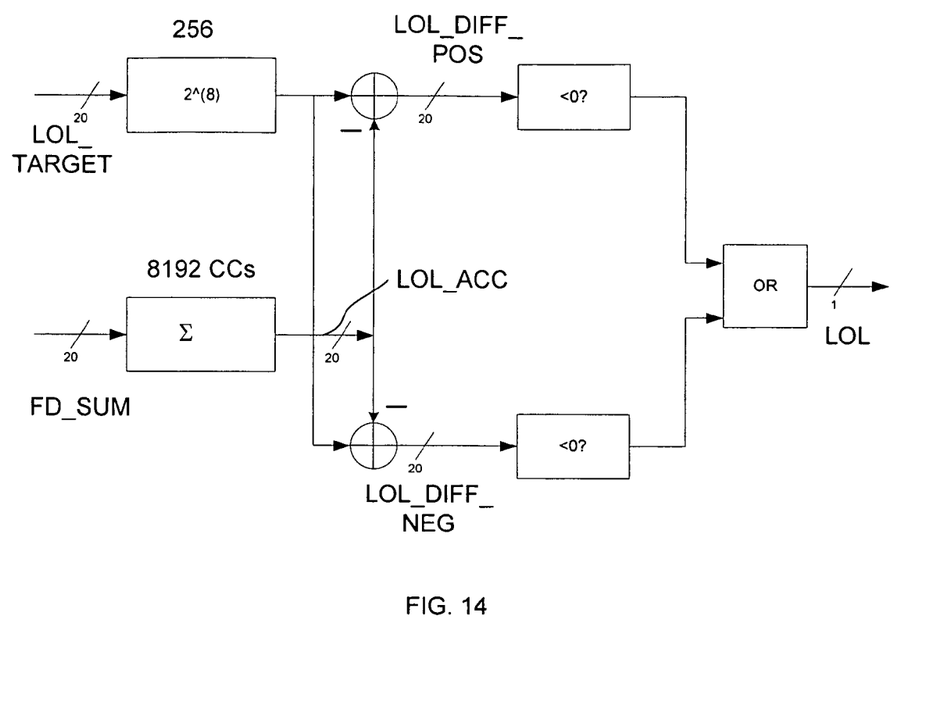
FIG. 14 is a block diagram illustrating loss of lock determination according to an embodiment of the present invention.

Referring next to FIG. 14, a data path for a loss of lock (LOL) indicator is discussed according to an embodiment of the present invention. The signal FD_Sum, which is the same signal FD_Sum illustrated in FIG. 13, is compared to a loss of lock target value LOL_TARGET. Recalling that FD_Sum may indicate either a number of frequency increase signals or a number of frequency decrease signals, both a positive and negative loss of lock differential signal are generated. The positive loss of lock differential signal LOL_DIFF_POS is used to determine if the number of frequency increases has exceeded the target value LOL_TARGET. Likewise, the negative differential signal LOL_DIFF_NEG is used to determine whether the number of frequency decrease signals exceeds the target value. If either LOL_DIFF_POS or LOL_DIFF_NEG are less than zero, a loss of lock signal LOL is generated.

Although various embodiments of the present invention have been shown and described in detail herein, many other varied embodiments of the present invention may be practiced without departing form the teachings set forth herein. These embodiments can be readily constructed by those skilled in the art. Accordingly, the present invention is not intended to be limited to the specific forms set forth herein, but to the contrary, includes such alternatives, modifications, and equivalents as can be reasonably included within the spirit and scope of the invention.

What is claimed is:

1. An apparatus comprising:
   a filter to receive a data signal and provide quadrant information associated with select data transitions of the data signal, wherein the data transitions are selected to have a variable number of other data transitions therebetween; and
   a detector to receive the quadrant information and assert one or more signals based on the quadrant information, the one or more signals being indicative of a frequency relationship between a clock embedded in the data signal and a recovered clock.

2. The apparatus of claim 1, wherein the filter initially selects data transitions having fewer data transitions therebetween than the number of data transitions between subsequently selected data transitions.

3. The apparatus of claim 1, wherein the number of data transitions between selected data transitions is varied based on a control state in which the detector is operating.

4. The apparatus of claim 1, wherein the number of data transitions between a first set of selected data transitions varies from a number of data transitions between a set of subsequently selected data transitions by at least one.

5. The apparatus of claim 1, wherein the number of data transitions between a first set of selected data transitions varies from a number of data transitions between a set of subsequently selected data transitions by more than one.

6. The apparatus of claim 1, further comprising a first counter coupled to determine a number of signals asserted by the detector and provide an indication thereof.

7. The apparatus of claim 6, further comprising a comparator coupled to compare the number signals indicated by the first counter to a threshold value, and to generate a loss of lock signal if the number of signals exceeds the threshold value.

8. The apparatus of claim 6, wherein the first counter includes:
   a first portion to count a number of signals indicative of a frequency increase; and
   a second portion to count a number of signals indicative of a frequency decrease.

9. The apparatus of claim 6, further comprising a second counter coupled to determine a number of signals asserted by the detector and provide an indication thereof, wherein the second counter operates out of phase with the first counter.

10. The apparatus of claim 1, further including a first transition counter coupled to count data transitions and provide an indication thereof.

11. The apparatus of claim 10, further including at least one additional transition counter to count the data transitions and provide an indication thereof, wherein the at least one additional transition counter operates out of phase with the first transition counter.

12. A system comprising:
at least one frequency detector to determine, from comparisons of quadrant data associated with data transitions selected to have a variable number of other data transitions therebetween, when a frequency of a recovered clock is different than a frequency of a data clock encoded in a data signal, and to provide an indication thereof; and
a controller configured to cycle through a plurality of control states, the controller coupled to receive the indication provided by the frequency detector and to generate a control signal based on the indication provided by the frequency detector and a control state.

13. The system of claim 12, wherein the number of data transitions between a first set of selected data transitions varies from a number of data transitions between a set of subsequently selected data transitions by at least one.

14. The system of claim 12, wherein the number of data transitions between a first set of selected data transitions varies from a number of data transitions between a set of subsequently selected data transitions by more than one.

15. The system of claim 12, wherein each of the plurality of control states causes the frequency detector to use a particular amount of delay in selecting data transitions.

16. The system of claim 12, further including a controllable oscillator to generate the recovered clock, wherein each of the plurality of control states causes a particular gain to be applied to an oscillator control signal.

17. The system of claim 16, wherein the gain applied in a particular one of the plurality of control states is less than the gain applied in a subsequent one of the plurality of control states within a given cycle.

18. The system of claim 16 wherein the gain applied in each of the plurality of control states is varied inversely to an amount of delay used in selecting data transitions for the particular control state.

19. The system of claim 12, wherein each of the plurality of control states causes a particular amount of dither to be randomly or pseudo randomly added to the recovered clock to shift a quadrant in which one or more data transitions is received.

20. The system of claim 19 wherein the particular amount of dither randomly or pseudo randomly added to the recovered clock varies inversely to an amount of delay used in selecting data transitions for each of the plurality of control states.

21. The system of claim 12, wherein the frequency detector comprises:
a filter to receive a data signal and provide the quadrant data; and
a detector to receive the quadrant data and assert one or more signals based on the comparisons of the quadrant data.

22. The system of claim 21, further including a first counter coupled to determine a number of signals asserted by the detector, and provide an indication thereof.

23. The system of claim 21, wherein the frequency detector further includes a first transition counter coupled to count a number of data transitions and provide an indication thereof.

24. The system of claim 23 wherein the indication provided by the first transition counter causes a frequency adjustment of the recovered clock to be inhibited if the number of data transitions is below a threshold.

25. The system of claim 22, wherein the first counter includes:
a first portion to count a number of signals indicative of a frequency increase; and
a second portion to count a number of signals indicative of a frequency decrease.

26. A method comprising:
selecting data transitions of a received data signal, each of the data transitions being associated with a respective quadrant and having a variable number of other data transitions therebetween; and
generating direction data based on a quadrant difference between a first data transition and a second data transition, the direction indicative of a frequency difference between a data clock encoded in the received data signal and a recovered clock.

27. The method of claim 26, wherein the selecting data transitions includes varying the number of data transitions between selected data transitions based on a control state.

28. The method of claim 26, wherein the number of data transitions between a first set of selected data transitions varies from a number of data transitions between a set of subsequently selected data transitions by at least one.

29. The method of claim 26, wherein the number of data transitions between a first set of selected data transitions varies from a number of data transitions between a set of subsequently selected data transitions by more than one.

30. The method of claim 26, further comprising adjusting the frequency of the recovered clock based, at least in part, on the direction data.

31. The method of claim 30, further comprising cycling through a plurality of control states, wherein the frequency adjustment of the recovered clock is controlled, at least in part, by respective control values of each control state.

32. The method of claim 31, wherein the frequency adjustment of the recovered clock is based, at least in part, on a gain value specified by a control state.

33. The method of claim 32, wherein the gain value specified by a control state is inversely proportional to a delay value specified by the control state.

34. The method of claim 31, wherein the frequency adjustment of the recovered clock is based, at least in part, on a dither value specified by a control state.

35. The method of claim 34, wherein the dither value changes in response to a change in control state, and wherein the dither value specified by the control state varies inversely to a delay value specified by the control state.

36. The method of claim 31, wherein the frequency adjustment of the recovered clock is based, at least in part, on a delay value specified by a control state.

37. The method of claim 26, wherein the direction data includes an indication of a number of frequency adjustments and respective adjustment directions to be made to a frequency of the recovered clock.

38. The method of claim 37, further including:
counting the number of frequency adjustments indicating an adjustment in a first direction; and
counting the number of frequency adjustments indicating an adjustment in a second direction.

39. The method of claim 26, further including counting a number of data transitions.

40. The method of claim 39, further including inhibiting adjustment of the recovered clock if the number of data transitions is below a threshold.

41. A device comprising:
means for selecting data transitions for comparison of quadrant data associated therewith, wherein the data transitions are selected according to a number of other data transitions therebetween; and means for determining a frequency relationship between a data clock encoded in the received data signal and a recovered clock based on the quadrant data, and generating an indication thereof.

42. The device of claim 41, further comprising means for varying the number of other data transitions between selected data transitions.

43. The device of claim 41, further comprising means for adjusting the recovered clock based, at least in part, on the indication generated by the determining means.

44. The device of claim 41, further comprising:

means for cycling through a plurality of control states; and means for controlling a frequency adjustment of the recovered clock, at least in part, according to respective control values of each control state.

45. The device of claim 44, wherein the determining means includes:

means for counting instances when the frequency of the data clock is greater than the frequency of the recovered clock; and means for counting instances when the frequency of the data clock is less than the frequency of the recovered clock.

46. The device of claim 41, further including means for inhibiting adjustment of the recovered clock if a number of data transitions is below a predetermined threshold.

47. The device of claim 41, further comprising means for varying the number of data transitions between selected data transitions by at least one.

48. The device of claim 41, further comprising means for varying the number of data transitions between selected data transitions by more than one.

* * * * *

UNITED STATES PATENT AND TRADEMARK OFFICE
CERTIFICATE OF CORRECTION

| | |
|---|---|
| PATENT NO. | : 7,502,434 B2 |
| APPLICATION NO. | : 10/813243 |
| DATED | : March 10, 2009 |
| INVENTOR(S) | : Eric T. King and Douglas Pastorello |

It is certified that error appears in the above-identified patent and that said Letters Patent is hereby corrected as shown below:

Col. 8, line 43, please replace "trails" with --trials--
Col. 8, line 56, please replace "trail" with --trial--

Signed and Sealed this

Fifth Day of May, 2009

JOHN DOLL
*Acting Director of the United States Patent and Trademark Office*